United States Patent [19]
Song et al.

[11] Patent Number: 5,710,064
[45] Date of Patent: Jan. 20, 1998

[54] METHOD FOR MANUFACTURING A SEMICONDUCTOR PACKAGE

[75] Inventors: Young Jae Song, Seongnam; Jeong Woo Seo, Suwon; Wan Gyun Choi, Seoul, all of Rep. of Korea

[73] Assignee: Samsung Electronics Co., Ltd., Suwon, Rep. of Korea

[21] Appl. No.: 513,309

[22] Filed: Aug. 10, 1995

[30]   Foreign Application Priority Data

Aug. 16, 1994 [KR] Rep. of Korea ............... 1994-20085

[51] Int. Cl.[6] .................................................. H01L 21/60
[52] U.S. Cl. ........................ 437/220; 437/207; 437/217; 257/666; 257/671
[58] Field of Search ........................ 437/207, 209, 437/217, 220; 257/666, 671

[56]    References Cited

U.S. PATENT DOCUMENTS

| | | |
|---|---|---|
| 4,992,628 | 2/1991 | Beppu et al. . |
| 5,042,147 | 8/1991 | Tashiro . |
| 5,084,753 | 1/1992 | Goida et al. . |
| 5,138,430 | 8/1992 | Gow, 3rd et al. ............... 437/207 |
| 5,177,032 | 1/1993 | Fogal et al. ..................... 437/220 |
| 5,256,598 | 10/1993 | Farnworth et al. ............. 437/207 |
| 5,347,709 | 9/1994 | Maejima et al. ................ 437/217 |
| 5,394,607 | 3/1995 | Chiu et al. ..................... 437/217 |
| 5,459,103 | 10/1995 | Kelleher et al. ............... 437/220 |
| 5,471,011 | 11/1995 | Maslakow . |
| 5,539,251 | 7/1996 | Iverson et al. . |

*Primary Examiner*—John Niebling
*Assistant Examiner*—Kevin F. Turner
*Attorney, Agent, or Firm*—Cushman Darby & Cushman Intellectual Property Group of Pillsbury Madison & Sutro LLP

[57]    ABSTRACT

A method for manufacturing a semiconductor package, including providing a lead frame in which die pad and side rail areas of the lead frame are mechanically interconnected to, and electrically isolated from each other so that the exposed bottom surface of the die pad does not become coated with a metal plating film during surface treatment for coating outer leads of the lead frame.

3 Claims, 3 Drawing Sheets

METHOD FOR MANUFACTURING A SEMICONDUCTOR PACKAGE

BACKGROUND OF THE INVENTION

1. Technical Field

This invention generally relates to method for manufacturing a semiconductor package same, and more particularly to a method in which the semiconductor package lead frame has a die pad having an exposed surface, the exposed surface being free of a plating film which is applied to the lead frame following encapsulation of a chip and wiring, for protecting the outer leads of the lead frame.

2. Description of the Prior Art

In general, semiconductor packages are electrically connected to other electronic devices via outer leads of lead frames which extend outwardly from side surfaces of the packages. The electrical connection of the outer leads with external electronic devices is chiefly accomplished by soldering. When the outer leads made of, e.g., aluminum, Fe-Ni alloy, or copper alloy are oxidized due to heat or moisture during subsequent assembly precesses, soldering of the outer leads may be disturbed.

Accordingly, the surfaces of the outer leads are usually treated with a metal material such as tin (Sn) or lead (Pb) after the molding process. The surface treatment of the outer leads is generally accomplished by a well-known electro-plating process, which usually follows the encapsulation process.

In addition, the lead frame pad (also, referred to as a 'die pad') of a certain type package, for example, an Ultra Thin Small Outline Package (which has been developed to meet the requirement for miniaturization of recent electronic devices, and has a thickness smaller than 0.5 mm), or a power IC, or a power QUAD package (which requires an excellent heat dissipation ability) should have an exposed surface, to meet the above mentioned requirements. In the above-mentioned special packages, the die pad, like that of normal packages, is electrically interconnected to a respective side rail area at each side of the lead frame by means of respective tie bars. When an electro-plating surface treatment is applied to the lead frame in order to plate the outer leads of the lead frame, the exposed surface of the die pad is also coated with the plating film.

However, since the plating film, which is commonly composed of tin (Sn), lead (Pb) or tin-lead alloy has usually a worse anti-corrosion property in comparison with the lead frame which is commonly made of aluminum or Fe-Ni alloy, the failure of the packaged device due to corrosion frequently occurs during the reliability test of the package. Further, when the package is mounted on a printed circuit board, a critical error of electrical short between the package and the PCB may occur, due to migration of the tin (Sn) component contained in the plating film coated on the surface of the die pad. In addition, since the plating film has a smooth and fragile surface, the film can be easily peeled off and crushed, resulting in rejection of the packaged device in a visual test.

In order to prevent the plating film from being coated on the exposed surface of die pad, it has been known to attach an insulating tape to the exposed surface of die pad before the plating process, and to remove the tape therefrom after the plating process.

The method using an insulating tape, however, necessitates performing additional steps, to attach and remove the tape. In addition, various types of tape are necessary, depending on the size of the exposed die pad and the dimensions of the lead frame. This results in an increase of cost and makes the assembly process complex.

SUMMARY OF THE INVENTION

An object of the present invention is therefore to provide a method in which a lead frame, which comprises a die pad on which a semiconductor chip is mounted, on which inner leads are electrically interconnected to the semiconductor chip by wires which are bonded to both the inner leads and the chip, on which outer leads are formed as one body with the inner leads, on which dam bars are formed between the inner leads on which there are and the outer leads, side rail areas coupled to both ends of the dam bars. A plating electrode potential is applied during a surface treatment process for the outer leads by an electro-plating method. The lead frame has at least two tie bars initially coupling the die pad and the side rail areas. The die pad has a surface exposed through a region that is intentionally not encapsulated by the molding resin during encapsulation.

The improvement provided by use of the method of the present invention is in that the die pad and the side rail areas are mechanically interconnected to each other, but electrically isolated from each other so that the facial region of the side of the die pad which is opposite to the one on which the chip is mounted, and which remains exposed after the encapsulation process, does not become electroplated by plating metal when the outer leads are protectively plated after the encapsulation process.

Another object of the present invention is to provide a method for plating the outer leads of lead frame with a tin, lead, tin alloy or lead alloy, in which the plating material is only coated on the outer leads, but is not coated on the exposed surface of die pad.

According to one aspect of the present invention, the die pad and side rail areas of the lead frame remain mechanically interconnected to each other at the time that encapsulation and thereafter plating occur but are electrically isolated from each other.

According to another aspect of the present invention, an additional tie bar is formed which is connected to a dam bar for preventing molding resin from overflowing during the encapsulation process while the tie bar coupled to die pad is segmented (i.e., severed by being cut through crosswise). An electrically insulating tape is then used to mechanically couple the segmented together in order to mechanically support the die pad. After that, die attachment, molding, and plating or surface treatment are sequentially performed.

According to still another aspect of the present invention, the plating process is carried out on a lead frame on which there is segmented a tie bar which has been coupled to the die pad after the molding process.

DETAILED DESCRIPTION OF THE INVENTION

Figure 1:
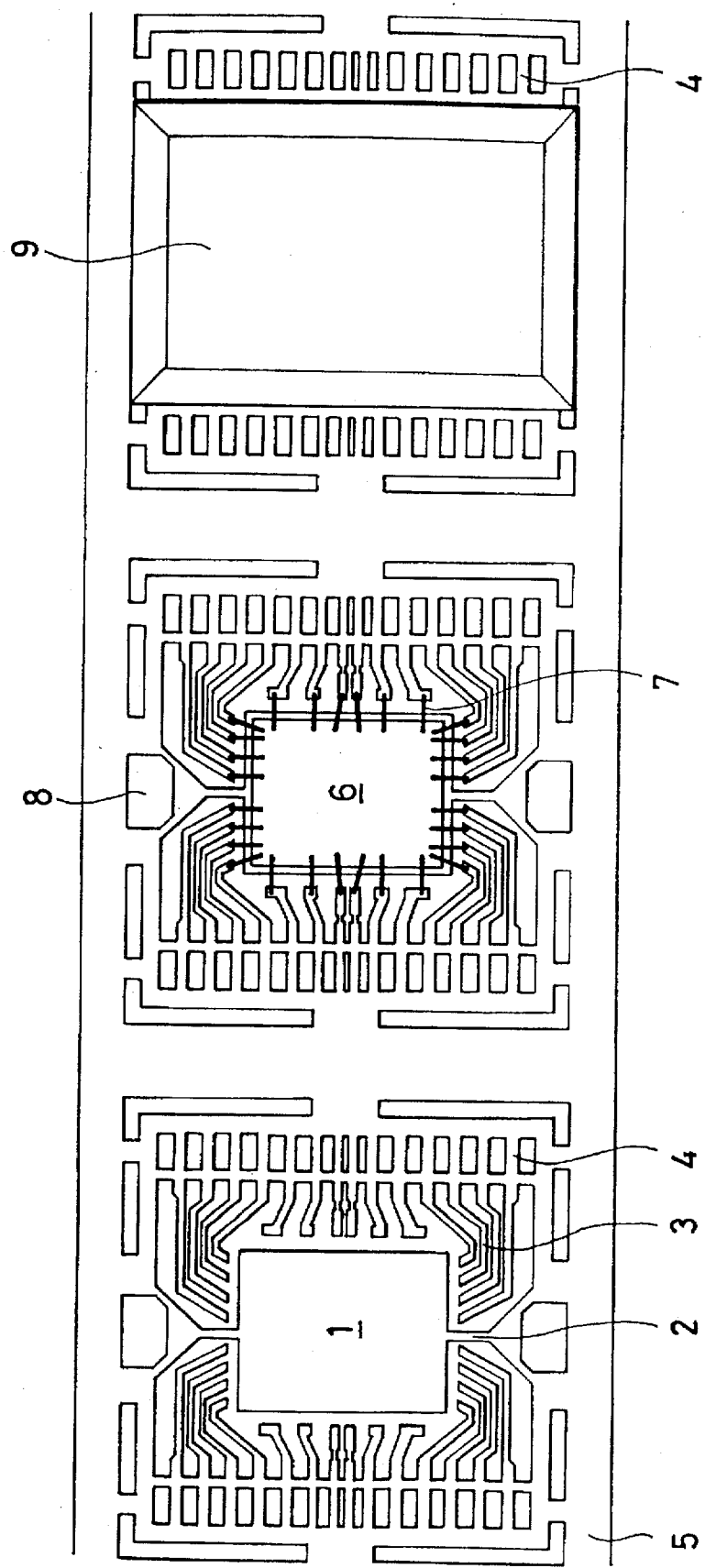
FIG. 1 shows a structure of the conventional lead frame.

FIG. 1 shows a structure of the conventional lead frame. Though a strip of lead frame will be applied to a single step, each lead frame will be described in connection with respective step of overall manufacturing process for the convenience. As shown in the left lead frame of of the lead frame strip FIG. 1, the lead frame includes a lead frame pad 1, a tie bar 2, inner leads 3, outer leads 4 and a side rail 5. The die pad 1 is not only electrically but also mechanically interconnected to the side rail 5 of the lead frame via the tie bar 2.

As shown in the lead frame located at the center of the strip of FIG. 1, on the die pad 1 there a semiconductor chip 6 is attached by a die attachment. The electrical interconnection of the lead frame with the semiconductor chip is completed by wires 7 bonded to the inner leads 3 and to the chip 6.

After placing the lead frame in a molding machine (not shown), encapsulation of the chip 6 is carried out by injecting a molding resin 9 into gates 8 of the lead frame, the result of which is shown on the rightmost lead frame of the strip in FIG. 1. At the time that the molding resin is injected, the injected molding resin should not exceeds the boundary of inner leads 3, outer leads 4, and the end line of the gates 8, respectively.

A surface treatment process using a plating method for the outer leads 4 is applied to the encapsulated lead frame. In the plating process, the lead frame is immersed in a suitable electrolyte solution, while direct current is introduced through an anode electrode which consists of the plating metal to be deposited. At this time, a cathode electrode is connected to the side rail area. By the method an Sn or lead plating film is deposited on outer leads of the lead frame by an oxidation-reduction reaction. However, when the bottom surface of the die pad 1 is exposed from the package body 9, this exposed surface also will be coated with the plating film, since the die pad 1 is electrically connected to the side rail 5 cathode electrode (not shown) via a tie bar 2.

Figure 2:
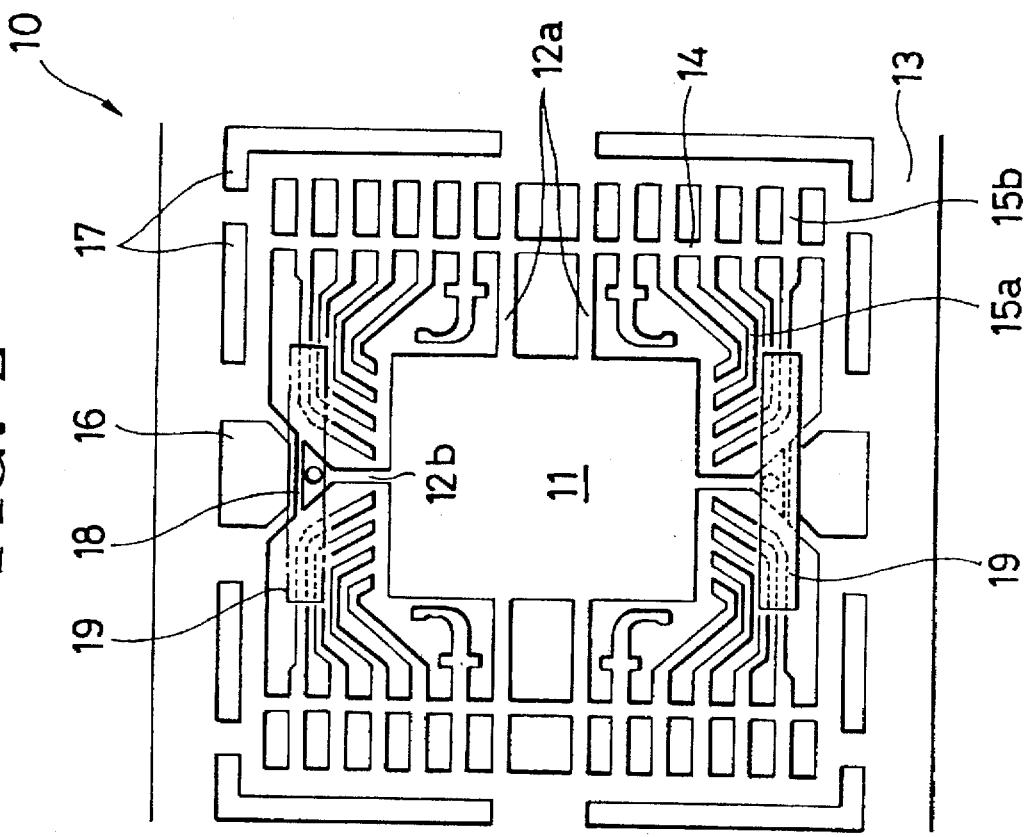
FIG. 2 shows an embodiment of a lead frame according to the present invention.

FIG. 2 shows an embodiment of a lead frame useful in the process according to the present invention. The lead frame 10 has a die pad 11 connected to side rail areas 13 through central tie bars 12a and corner tie bars 12b. Between inner leads 15a and outer leads 15b for electrically interconnecting the packaged device with external circuit devices, dam bars 14 are formed in order to prevent a molding resin from bleeding out onto the outer leads during the molding process. The lead frame 10 also has gates 16 through which the molding resin will be injected, and a number of slits 17 suitable for use in transferring the lead frame.

The lead frame 10 of the present invention as shown in FIG. 2 can be manufactured as follows: In a stamping or selective etching step, pre-designed inner and outer lead patterns and the die pad and other features of the lead frame as shown in FIGS. 2 are formed together, including the central tie bars 12a, which are located at the center of the die pad 11 and coupled to the dam bars 14 for supporting the die pad 11. The corner tie bars 12b, which couple the die pad 11 with the respective side rail areas 13, are each completely divided crosswise, at 18, into two physically and electrically discontinuous portions, and then the divided portion of each are mechanically but not electrically coupled together by an electrically insulating tape, for example, a respective piece of polyimide tape 19. At this time, the width of each portion cut out to form the gaps 18 is, if a sufficient insulating effect can be obtained, minimized, in order to guarantee the supporting of the die pad.

With the lead frame having such structure, the die pad 11 can be absolutely electrically isolated from the side rail areas 13 of the lead frame (and particularly from the one to which the cathode will be attached for the plating process), by cutting off (or through) the dam bars 14 after carrying out the mounting of a semiconductor chip onto the die pad 11, wire bonding, and molding with a molding resin. Although the die pad 11 at that stage has an exposed surface, the plating film is formed onto the exposed surface during the surface treatment process for coating the outer leads with the plating film. And, during carrying out the steps of manufacturing the lead frame and of plating the outer leads, the die pad 11 is firmly supported by the insulating tape 19, as well as by the central tie bars 12a, so that the wire bonding or molding step can be accomplished in a stable state.

Figure 3:
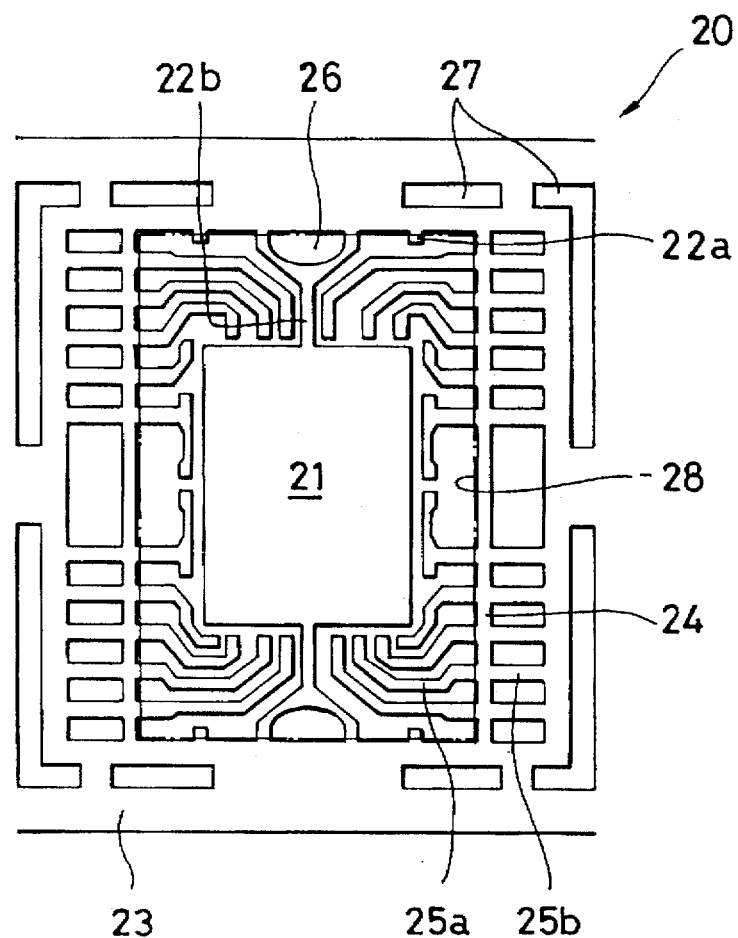
FIG. 3 shows another embodiment of a lead frame according to the present invention.

FIG. 3 shows another embodiment of the a lead frame for use in the method according to the present invention. Like the former embodiment, dam bars 24 are formed between inner leads 25a and outer leads 25b at both sides of the die pad 21 in order to prevent a molding resin from flowing over the outer leads 25b.

Gates 26 through which a molding resin will be injected, are formed between of a die pad 21 and the two side rails, and tie bars 22b, as in the conventional lead frame as shown in FIG. 1, connect the die pad 21 to areas side rail area 23. At right and left sides of the tie bars 22b (assuming the orientation shown in FIG. 3) are formed auxiliary tie bars 22a which extend in a medial direction of the strip on which the lead frame 20 is shown provided, from each side rail area 23, but terminate short of and therefore do not contact the inner leads 25a or the die pad 21. The function and role of the auxiliary tie bars will be described below.

If a plating process were to be carried out with the lead frame 20, after the molding process mentioned above has been performed, the lead frame 20, which has the side rail 23 and the die pad 21 coupled to each other by tie bars 22b, the exposed bottom surface of the die pad 21 will be coated with the plating film. To avoid this problem, the tie bars 22b should be segmented (i.e., each severed crosswise, as has been described above with reference to the embodiment of FIG. 2) in order to electrically isolate the die pad from the side rails before carrying out the plating process. In the manufacture of semiconductor packages, the plating process is usually carried out after molding process is completed and then the dam bars 24 are cut off, in order for the cut portions of the lead frame flanking where the dam bar to be coated with plating film as well. Therefore, if the tie bars 22b also were cut off, the die pad 21 would not be supported, since the molding resin would be injected into the area indicated by the dotted line 28 of the FIG. 3.

However, in the second embodiment of the method of the present invention, the auxiliary tie bars 22a are formed so as to extend from the respective side rails 23 to within the area bounded by the dotted line 28, i.e., within the perimeter of where the molding compound will become located. As a result, the die pad 21 is supported by the auxiliary tie bars 22a, even though tie bars 22b are cut off. When this type of lead frame is subjected to plating process, the exposed surface of die pad 21 does not become coated with the plating film.

Figure 4:
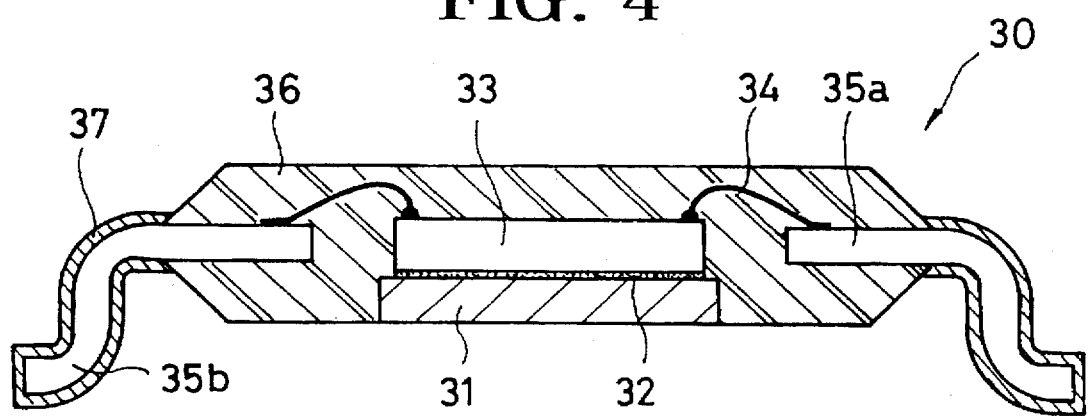
FIG. 4 is a cross sectional view of a semiconductor package utilizing a lead frame of the present invention, wherein the die pad of the lead frame has an exposed surface.

FIG. 4 is a vertical transverse cross-sectional view of a semiconductor package utilizing a lead frame provided in accordance with the method of the present invention, the die pad of which has an exposed bottom surface (referring to the orientation shown in FIG. 4). On the die pad 31, a semiconductor chip 33 is shown mounted by an adhesive 32 such as silver epoxy. The chip is encapsulated by a molding resin 36 a molding process. Outer leads 35b of the lead frame made according to the present invention, are then coated with a metal plating film a electro-plating method. Because the die pad 31 is electrically isolated from the plating electrode (not shown), the metal plating film 37 will be coated only on the outer leads 35b.

As explained hereinbefore, since the exposed bottom surface of die pad is not coated or deposited with a metal plating film during electro-plating process for plating the outer leads of lead frame, corrosion of the packaged device during reliability tests, failures in passing the visual tests, or an electrical failure of the package can be prevented.

Although the present invention is described hereinabove with reference to the accompanying drawings, the description is only illustrative and the method of the invention is not limited to this. For example, the embodiments of the present invention of FIGS. 2 and 3 illustratively show means for electrically isolating and mechanically interconnecting the side rails of a lead frame with a die pad, but any modification and variation of the embodiments will be apparent to those having ordinary skill in the art, without departing the spirit and scope of the present invention.

What we claim is:

1. A method for manufacturing a semiconductor package, comprising the steps of:

(a) providing a lead frame having a die pad having one face arranged to have a semiconductor chip mounted thereto and an opposite face, having a plurality of inner leads spaced from one another beyond the outer perimeter of the die pad, having a plurality of outer leads integrally extending from respective ones of the inner leads and further from the die pad, having two dam bars provided so as to be respectively located spaced from a first set of two laterally opposite sides of the die pad so as to form temporary interconnections between leads where respective outer leads integrally extend from respective inner leads, having two side rails respectively spaced from a second set of two longitudinally opposite sides of the die pad, having the two dam bars at longitudinally opposite ends thereof connecting with the respective side rails, so as to define inwardly of a perimeter defined by the dam bars and side rails the outer perimeter of a region to be encapsulated, and having at least two oppositely extending tie bars, each connecting a respective side of the die pad with a respective side rail;

(b) mounting a semiconductor chip on said one face of said die pad;

(c) cutting across and thereby severing said tie bars;

(d) electrically connecting a plurality of wires between the semiconductor chip and respective ones of said inner leads;

(e) encapsulating with a molding material the semiconductor chip, wires, inner leads, and said one face of said die pad out to said outer perimeter of said region to be encapsulated, while leaving a said opposite face of said die pad exposed, and while providing mechanical support for said die pad relative to said side rails within said outer perimeter of said region;

(f) cutting said dam bars from extending between respective of said outer leads of said lead frame; and (g) electroplating a protective metallic coating onto said outer leads, in an electroplating process in which at least one said side rail is used as a cathode, and during which said exposed opposite face of the die pad, being relatively electrically isolated from the side rails, remains unplated by said metallic coating.

2. The method of claim 1, wherein:

step (c) results in disconnected segments being made of said tie bars; and said providing of mechanical support, of step (e), is accomplished by taping across respective of said segments using respective pieces of electrically insulative tape, before performing said encapsulating.

3. The method of claim 1, wherein:

said providing of said mechanical support, of step (e), is accomplished by providing said lead frame, in step (a) to further include a plurality of medially extending auxiliary tie bars as projections based on respective of said side rails and ending at free ends within said outer perimeter of said region.

* * * * *